June 28, 1966 R. A. MEADOWS 3,258,606

INTEGRATED CIRCUITS USING THERMAL EFFECTS

Filed Oct. 16, 1962

Robert A. Meadows
INVENTOR

BY John G. Graham

ATTORNEY 3,258,606

INTEGRATED CIRCUITS USING THERMAL EFFECTS

Robert A. Meadows, Richardson, Tex., assignor to Texas Instruments Incorporated, Dallas, Tex., a corporation of Delaware Filed Oct. 16, 1962, Ser. No. 230,946

4 Claims. (Cl. 307—88.5)

Figures 1, 2, 3, 4:
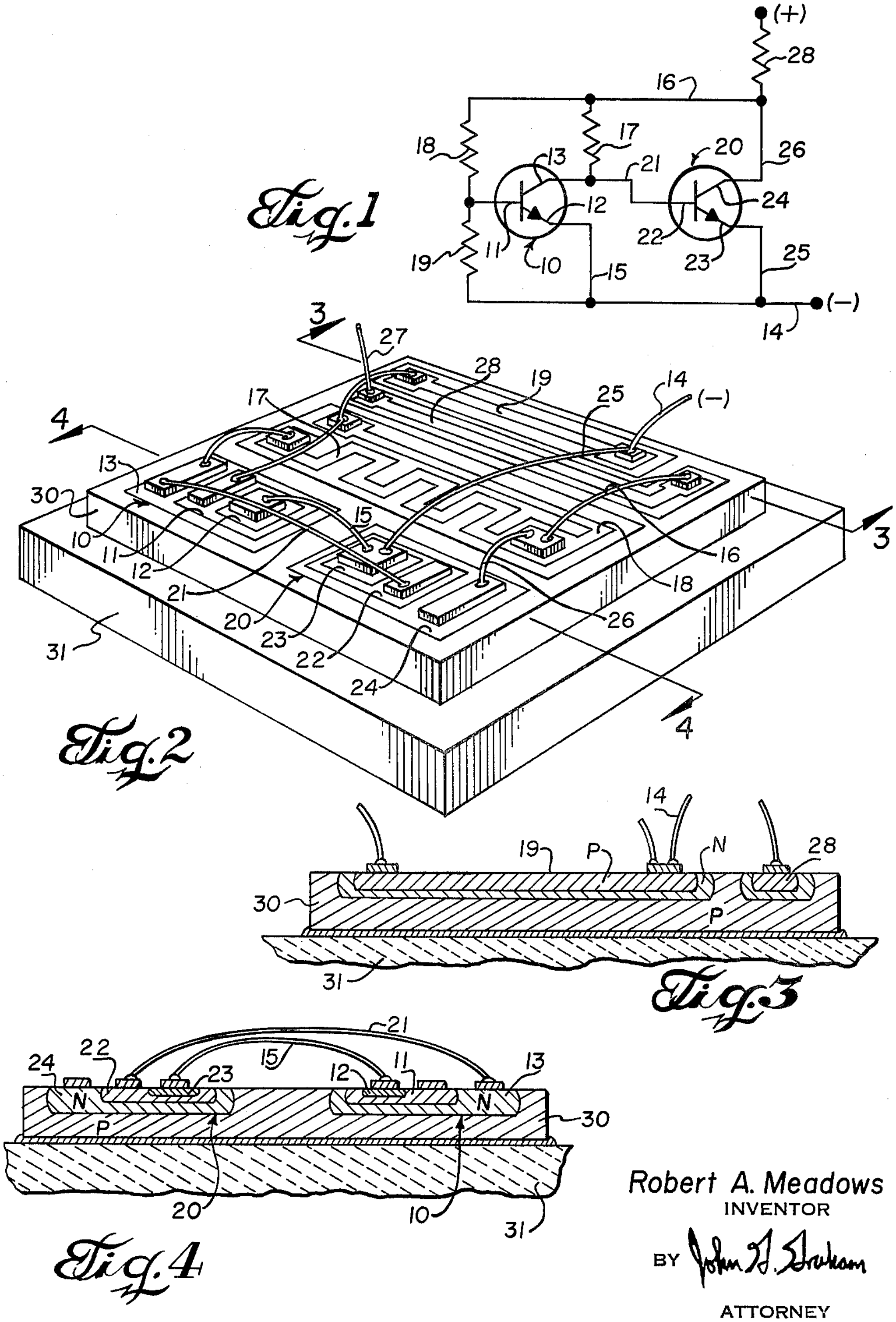

This invention relates to semiconductor devices which utilize the interaction between electrical and thermal characteristics, and more particularly to integrated circuit devices employing thermal coupling elements adapted to operate as low frequency oscillators, filters or the like.

As discussed in the co-pending application Serial No. 222,235, filed September 7, 1962, assigned to the assignee of the present invention, the inherent interaction between electrical and thermal characteristics in integrated semiconductor circuits may be used to advantage as thermal negative feedback. Heat generated in the collector circuit of one transistor stage is coupled back to the base-emitter area of a transistor in a previous stage to provide feedback operation useful in D.C. stabilization of amplifier circuits or temperature stabilization of a semiconductor substrate. It is now proposed, however, to utilize this thermal feedback in a positive sense so that integrated circuits such as oscillators, multivibrators, and low-pass, high-pass and band-pass filters may be provided.

A variation in the temperature at one point in a semiconductor wafer will be transmitted to another point after a delay dependent upon the geometry and material, and with an attenuation dependent upon like factors. For a periodically varying heat source, there will be some point on the wafer where the variation in temperature is 180° out of phase with the source. This delay can be used to great advantage in a coupling element for an oscillator.

It is the principal object of this invention to provide an integrated circuit oscillator device which operates at very low frequencies. Another object is to make use of the frequency dependence of thermal conduction through a semiconductor body to provide an integrated circuit having particular frequency response characteristics. An additional object is to provide a coupling element for integrated circuit devices which is useful at very low frequencies.

In accordance with this invention, an electrical-to-thermal transducer is positioned at one point on a semiconductor wafer and acts as a heat source, while a thermal-to-electrical transducer is also positioned on the wafer spaced away from the heat source. This spacing is critical in determining the frequency or delay characteristics of the coupling device. Both of the transducers may be transistors, the collector dissipation of one transistor providing the heat source, which may be sinusoidally varying, and the base-emitter region of the other transistor being responsive to temperature. For some particular frequency the variations in temperature at the latter transistor will be 180° out of phase with the periodic temperature change at the first transistor. In one embodiment of the invention, this feature can be used along with an amplifier having suitable gain to provide an oscillator.

The novel features which are believed to be characteristic of this invention are set forth in the appended claims. The invention will best be understood, however, by reference to the following detailed description of an illustrative embodiment, when read in conjunction with the accompanying drawing, wherein:

FIG. 1 is a schematic diagram of an oscillator circuit according to this invention;

FIG. 2 is a pictorial view, greatly enlarged, of a semiconductor network form of the circuit of FIG. 1; and FIGS. 3 and 4 are sectional views of the semiconductor network of FIG. 2 taken along the lines 3—3 and 4—4, respectively.

With reference to FIG. 1, a low frequency oscillator circuit for use in semiconductor network form is illustrated. This circuit is similar in form to the temperature stabilization circuit described in the co-pending application S.N. 222,235, but utilizes the principle that 180° phase shift will be provided in the thermal feedback characteristic at some frequency for a given spacing between the output and input transistors. The oscillator of FIG. 1 employs a first transistor 10 having a base 11, an emitter 12 and a collector 13. The emitter is directly connected to a negative supply line 14 by a conductor 15, while the collector is connected to a positive line 16 through a load resistor 17. The base 11 is connected to the mid-point of a voltage divider including a large resistor 18 and a smaller resistor 19 connected across the lines 14 and 16. This establishes the base bias for the transistor 10 at some fixed percentage of the voltage across these lines. The collector 13 of the transistor 10 is directly connected to the base of a transistor 20 by a conductor 21. This transistor 20 likewise includes a base 22, and emitter 23 and a collector 24, with the emitter and collector being directly connected to the lines 14 and 16 by conductors 25 and 26, respectively. The line 16 is connected to a positive voltage supply 27 through a resistor 28 which is effective to provide additional overall gain for the two stages by introducing a slight amount of positive feedback to the base of the transistor 10.

The circuit of FIG. 1 may be fabricated in semiconductor network form as seen in FIG. 2, where all of the components are provided in a silicon wafer 30. The transistors 10 and 20 are of the triple-diffused planar NPN type, while the resistors 17, 18, 19 and 28 are elongated diffused regions. The starting material for the wafer 30 would be P-type silicon doped with boron in growing to produce a resistivity of perhaps 10 to 15 ohm-cm. An oxide coating is applied to the top surface, and photo-resist masking techniques may be used to expose selected areas of the surface defining the outlines of the collector regions and the isolating regions underneath the resistors. An N-type diffusion is then performed by depositing phosphorus on the top surface of the wafer and heating at diffusion temperatures for a time adequate to produce a junction depth of perhaps 0.15 mil, the unremoved oxide coating acting as a mask for the phosphorus diffusion. Another oxide coating is provided, and selected portions of this coating are removed by photo-resist methods to expose the outlines of the transistor base regions and the resistors. A P-type diffusion is then performed by depositing boron and heating at about 1200° C. for several hours or until a junction depth of perhaps 0.05 mil results. More oxide is formed, the outlines of the emitters are exposed by another masking and etching process, and a second N-type diffusion is performed by depositing phosphorus and heating, providing a 0.01 mil junction depth. The contacts are then applied by selectively etching holes in the oxide coating and evaporating aluminum onto the exposed surface areas of the silicon wafer. Interconnecting leads are provided by ball bonding gold wires between the appropriate contacts as seen in FIG. 2, or by evaporating aluminum strips over the top of the oxide coating in accordance with the usual practice.

The particular form of the integrated network is not material here, FIG. 2 being merely illustrative, but it is necessary that the two transistors be thermally coupled so that heat generated by the transistor 20 due to collector dissipation will be fed back to the transistor 10. This will be the case in the semiconductor network of FIG. 2 since the transistors are separated from one another only by an elongated path through the silicon wafer 30, as best seen in the cross-sectional view of FIG. 4. The wafer 30 is mounted on a thermally-insulating ceramic base 31 which prevents excessive loss of the heat generated in the network so that the power level for operation of the circuit will be fairly low.

In operation of the integrated circuit of FIGS. 1 and 2, when a voltage supply is applied between the lines 27 and 14, the voltage on the base of the transistor 10, determined by the values of the resistors 18, 19 and 28, will be less than the base-emitter voltage required to turn on the transistor 10. Accordingly, the collector-emitter current for this transistor will be zero. The resistor 17 is much larger than the base-emitter input impedance of the transistor 20 and so determines the current in this resistor, this current being virtually constant even when the transistor 10 conducts. The current through the resistor 17 is thus the base current of the transistor 20, and its collector current will be approximately the product of the gain and base current. Ignoring the resistor 28, the power dissipated as heat in the region of the collector 24 will be the product of the applied supply voltage and the collector current. This raises the temperature in this region and a temperature gradient is established causing heat flow outward from the transistor 20. Since all of the components are in a single substrate, the temperature at the base-emitter region of the transistor 10 will be increased, so the base-emitter voltage required for conduction of this transistor will be reduced. At some temperature the transistor 10 will start to conduct, and since the current through the resistor 17 is virtually constant, the base current for the transistor 20 will be reduced and so will its collector current. This reduces heat dissipation in the collector, and, ignoring the thermal delay and the positive feedback provided by the resistor 28, an equilibrium point would eventually be reached where there is just enough heat supplied to maintain the base-emitter region of the transistor 10 at a constant temperature. If the ambient temperature increases, the temperature of the base-emitter region of the transistor 10 would increase and its collector current would likewise increase. This reduces the base current for the transistor 20, and likewise reduces its collector current and the heat generated thereby, so less heat is applied to the transistor 10. The temperature of the wafer tends to decrease to the previously-established equilibrium value. Using the same reasoning, temperature decreases are also counteracted. This integrated circuit provides a simple mechanism for controlling the temperature of a semiconductor substrate as set forth in the above-mentioned co-pending application S.N. 222,235; and when used for this purpose the resistor 28 is undesirable.

The semiconductor network described above operates generally as a feedback system with the feedback provided by thermal coupling between the transistor 20 and the transistor 10. As discussed thus far, the feedback is negative, but the explanation above ignores thermal delay. There is a finite time delay associated with the heat flow from the transistor 20 to the transistor 10, and so under proper physical conditions as to size, shape and material, this feedback can be positive. If the classic requirements on gain and feedback ratio are satisfied, the integrated circuit will be unstable and oscillate.

The electrical circuit analog of thermal conduction is current flow through a transmission line made up of series resistance and distributed shunt capacitance. Heat flow and temperature correspond to current flow and voltage, respectively. The time delay between a change in heating effect at the transistor 20 and its detection as a change in temperature at the transistor 10 can also be considered in terms of the transistor 10 detecting a change in phase and attenuation of a thermal wave propagating outward from the transistor 20. This is identical to considering an electrical transmission line from either the time delay or phase shift point of view. When considered in terms of phase shift, thermal oscillation should result when the phase of the thermal wave is shifted by 180°, provided the electrical gain of the amplifier overcomes all the thermal losses. Phase shift and attenuation of thermal waves are determined by the geometry of the conduction path and the physical constants of the conduction medium. These constants are density, thermal conductivity, and specific heat. Since the phase shift and frequency are related, the frequency of oscillation of the integrated circuit is also determined by the geometry and thermal characteristics of the feedback path.

Considering the operation of the integrated circuit of FIGS. 1 and 2 in view of the concepts of positive thermal feedback, it is noted that for a particular frequency as determined by the device geometry and material, the change in temperature reaching the transistor 10 will be 180° out of phase with the change in temperature of the transistor 20. This will produce positive feedback to the base of the transistor 20 and the circuit will oscillate if the electrical gain is sufficient. Additional electrical gain is provided by the resistor 28. Voltage variations developed across this resistor will be principally due to changes in the collector current of transistor 20, since this current will be much greater than that through the transistor 10. Such variations will appear on the base of the transistor 10 as positive feedback. By increasing the value of the resistor 28, the apparent gain of the amplifier is increased, and the circuit will oscillate. Since this feedback is not frequency selective, the frequency of oscillation is determined by the thermal feedback circuit. Ordinarily the magnitude of the resistor 28 would have to be much less than that of the resistors 17, 18 and 19.

It is helpful to consider the oscillator described above as an amplifier with a thermal coupling element in the feedback loop. This thermal coupling element, which may act as a low pass filter, is a semiconductor body of certain configuration providing thermal conduction characteristics. Assume that a sinusoidally varying temperature source is applied to one end of an elongated rectangular silicon bar. Thermal delay will cause the temperature at some point a distance X from the heat source to vary in a manner 180° out of phase with the source. This distance X for 180° shift will be dependent upon the frequency of the source. Stated another way, for a given distance X there will be a particular frequency $f$ which will be shifted 180°. It can be established that this relationship is $f=0.245/X^2$. For $X=1$ mil, the frequency which would be shifted 180° would be 243 kc., while 10 mils would provide a 2430 cycle frequency and 100 mills would correspond to 24 c.p.s. It is thus seen that very low frequencies are available for reasonable sizes in an integrated circuit. At the point of 180° shift, it can be established that the particular frequency is attenuated by the factor $c^{-\pi}$, and so a forward gain of greater than about twenty-three is necessary to produce oscillation. Similar computations can be made with a disc-shaped structure which is more analogous to a transistor type device. If a sinusoidally varying heat source is applied to the center of a disc of silicon, there will be some point a distance $r$ from the center where the phase shift will 180°. A relationship $f(r)$ will exist quite similar to $f(x)$ above, while the attenuation will be somewhat greater than the $c^{-\pi}$ function mentioned here.

The integrated circuit described above could be made to oscillate sinusoidally by selecting the gain of the stages, or could operate to provide a rectangular output by increasing gain. Also, the thermal effect device of this invention could be used as a cross-coupling element in a multivibrator, in which case merely the time delay would be utilized rather than the 180° phase shift feature. In any case the frequency of oscillation or repetition rate would be much lower than can be realized by resistance-capacitance combinations in integrated circuit form.

While this invention has been described with reference to a particular embodiment, this description is merely illustrative of the principles involved and is not meant to be construed in a limiting sence. Various modifications of the illustrated embodiment, as well as other embodiments of the inventive concept, will be readily apparent to those skilled in the art upon reading this description. Accordingly, it is contemplated that the appended claims will cover any such modifications or embodiments as fall within the true scope of the invention.

What is claimed is:

1. Coupling means for an electronic circuit comprising a semiconductor body at least part of the semiconductor body being a thermal propagation path, means engaging one end of the path for applying heat thereto corresponding to a varying electrical current having a component of a given frequency, means engaging the other end of the path for providing an electrical signal corresponding to the temperature thereof with said electrical signal having a component of said given frequency, the path having a length such that periodic variations in said heat applied to said one end of the path of said given frequency are thermally coupled through the path and reach said other end with a delayed phase relationship, the variation in said electrical signal at said given frequency lagging by about 180° said component of said given frequency of said electrical current.

2. In combination with the coupling means of claim 1, mean connected to receive said electrical signal and effective to vary said electrical current in response thereto, the electrical current being amplified with respect to said electrical signal by said last mentioned means.

3. In an electronic circuit:

(a) a first transistor having base, emitter and collector regions,
(b) means including a collector load resistor connecting the collector and emitter of the first transistor across a voltage supply,
(c) means for biasing the base of the first transistor at a fixed voltage level,
(d) a second transistor having base, emitter and collector regions,
(e) means connecting the collector and emitter of the second transistor across a voltage supply,
(f) and a thermally-conductive path connecting the collector region of the second transistor to the base and emitter regions of the first transistor so that the collector current conduction of the first transistor is responsive to the collector dissipation of the second transistor, the path having a length such that periodic variations in the collector dissipation of the second transistor of a selected frequency are thermally coupled through the path and reach the first transistor with a delay phase relationship, the variation in the collector current of said first transistor at said frequency lagging that in said second transistor by about 180°.

4. In an integrated electronic circuit:

(a) a wafer of semiconductor material,
(b) a first transistor formed in said wafer having base, emitter and collector regions,
(c) means including a collector load resistor adapted for connecting the collector and emitter of the first transistor across a voltage supply,
(d) resistive means adapted to be connected to said voltage supply for biasing the base of the first transistor at a fixed voltage level,
(e) a second transistor formed in said wafer having base, emitter and collector regions,
(f) means adapted for connecting the collector and emitter of the second transistor across said voltage supply,
(g) and a thermally-conductive path within said wafer connecting the collector region of the second transistor to the base and emitter region of the first transistor so that the collector current conduction of the first transistor is responsive to the collector dissipation of the second transistor, the path having a length such that periodic variations in the collector dissipation of the second transistor of a selected frequency are thermally coupled through the path and reach the first transistor with a delayed phase relationship, the variation in the collector current of said first transistor at said frequency lagging that in said second transistor by about 180°.

References Cited by the Examiner

UNITED STATES PATENTS

| | | | |
|---|---|---|---|
| 2,847,583 | 8/1958 | Lin | 330—38 X |
| 2,938,130 | 5/1960 | Noll. | |
| 3,050,638 | 8/1962 | Evans et al. | 307—88.5 |
| 3,107,331 | 10/1963 | Barditch et al. | 330—26 X |
| 3,110,870 | 11/1963 | Ziffer | 317—101 X |
| 3,128,431 | 4/1964 | Walker | 330—23 X |
| 3,165,708 | 1/1965 | Stelmak et al. | 307—88.5 |

RAY LAKE, *Primary Examiner.*

JOHN KOMINSKI, *Examiner.*

J. B. MULLINS, *Assistant Examiner.*